(12) United States Patent
Glenn et al.

(10) Patent No.: US 6,441,504 B1
(45) Date of Patent: Aug. 27, 2002

(54) PRECISION ALIGNED AND MARKED STRUCTURE

(75) Inventors: Thomas P. Glenn, Gilbert, AZ (US); Steven Webster, Chandler, AZ (US); Gary L. Swiss, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/558,397

(22) Filed: Apr. 25, 2000

(51) Int. Cl.$^7$ .............................................. H01L 23/544
(52) U.S. Cl. ...................................... 257/797; 257/730
(58) Field of Search ................................. 257/797, 759, 257/503, 638, 730; 438/401

(56) References Cited

U.S. PATENT DOCUMENTS

| | | | |
|---|---|---|---|
| 5,237,199 A | * 8/1993 | Morita | 257/797 |
| 5,362,681 A | 11/1994 | Roberts, Jr. et al. | 437/226 |
| 5,843,831 A | * 12/1998 | Chung et al. | 438/401 |
| 5,899,729 A | 5/1999 | Lee | 438/460 |
| 5,917,237 A | * 6/1999 | Furano et al. | 257/797 |
| 5,923,995 A | 7/1999 | Kao et al. | 438/460 |
| 5,943,587 A | 8/1999 | Batterson et al. | 438/401 |
| 5,972,234 A | 10/1999 | Weng et al. | 216/44 |
| 5,981,314 A | 11/1999 | Glenn et al. | 438/127 |
| 6,004,405 A | 12/1999 | Oishi et al. | 148/33.2 |
| 6,066,513 A | 5/2000 | Pogge et al. | 438/113 |
| 6,068,954 A | 5/2000 | David | 430/22 |
| 6,080,635 A | 6/2000 | Jang et al. | 438/401 |
| 6,087,202 A | 7/2000 | Exposito et al. | 438/113 |

OTHER PUBLICATIONS

EV620 Precision Alignment System, 5 pages, Mar. 7, 2000.

* cited by examiner

*Primary Examiner*—Roy Potter
(74) *Attorney, Agent, or Firm*—Gunnison, McKay & Hodgson, L.L.P.; Serge J. Hodgson

(57) ABSTRACT

A structure includes a substrate such as a wafer or an array of packages. The substrate has a front-side surface and a back-side surface. A reference feature such as a scribe grid is on the front-side surface. In at least one alignment mark is on the back-side surface, the alignment mark having a precise positional relationship to the reference feature on the front-side surface. The reference mark is used to cut the substrate from the back-side surface.

25 Claims, 7 Drawing Sheets

PRECISION ALIGNED AND MARKED STRUCTURE

FIELD OF THE INVENTION

The present invention relates generally to electronic packaging. More particularly, the present invention relates to a marked structure such as a wafer or an array of packages.

BACKGROUND OF THE INVENTION

As is well known to those of skill in the art, integrated circuits, i.e., electronic components, are fabricated in an array on a wafer. The wafer is then cut, sometimes called diced, to singulate the integrated circuits from one another.

FIG. 1 is a cross-sectional view of a section of a wafer 10 being cut from a front-side surface 10F of wafer 10 in accordance with the prior art. Formed in wafer 10 were integrated circuits 12. Integrated circuits 12 were delineated by scribe lines 14, which included a first scribe line 14A and a second scribe line 14B, on front side surface 10F of wafer 10. For example, scribe lines 14 were formed by selective etching of a silicon oxide layer 18 on front-side surface 10F.

To illustrate, first scribe line 14A delineated a first integrated circuit 12A from a second integrated circuit 12B. Each scribe line 14 had a width WF.

A back-side surface 10B of wafer 10 was attached to a tape 20. Wafer 10 was then sawed with a saw blade 22. Saw blade 22 was aligned with scribe lines 14 using an optical alignment system in a well-known manner. Saw blade 22 cut through wafer 10 along scribe lines 14. In this manner, integrated circuits 12 were singulated. Tape 20 supported wafer 10 during sawing and supported the singulated integrated circuits 12 after sawing was complete.

Generally, width WF of scribe lines 14 was sufficient to accommodate the width of the saw cut plus tolerance in the positioning of saw blade 22. Stated another way, width WF of scribe lines 14 was sufficiently large such that the saw cut made by saw blade 22 was always within a scribe line 14. For example, saw blade 22 is within scribe line 14B in FIG. 1.

Since the optical alignment system used scribe lines 14 directly to align saw blade 22, saw blade 22 was aligned to scribe lines 14 to within tight tolerance. Accordingly, scribe lines 14 were relatively narrow and, more particularly, were only slightly wider than saw blade 22. To illustrate, width WF was within the range of 0.002 inches (0.051 mm) to 0.008 inches (0.203 mm).

In certain instances, it was important to protect the front-side surface of the wafer during sawing, e.g., from shards and particulates generated during sawing. To protect the front-side surface, the wafer was sawed from the back-side surface of the wafer as discussed below in reference to FIG. 2.

FIG. 2 is a cross-sectional view of a section of a wafer 30 being cut from a back-side surface 30B of wafer 30 in accordance with the prior art. To protect a front-side surface 30F of wafer 30, front-side surface 30F was attached to a tape 32. Tape 32 supported wafer 30 during sawing.

Saw blade 22 was aligned with scribe lines 14-1 on front-side surface 30F of wafer 30 using a two-step process. First, tape 32 was aligned with scribe lines 14-1. Front-side surface 30F was attached to tape 32. Tape 32 had area greater than the area of front-side surface 30F such that tape 32 had an exposed region, which extended beyond wafer 30. Tape 32 had alignment marks in the exposed region of tape 32. As an example, see alignment holes 30a and 30b of Roberts, Jr. et al., U.S. Pat. No. 5,362,681, which is herein incorporated by reference in its entirety. In the above manner, scribe lines 14-1 were aligned with the alignment marks of tape 32.

Second, saw blade 22 was aligned with the alignment marks of tape 32. Wafer 30 was then sawed with saw blade 22 from back-side surface 30B. However, since saw blade 22 was aligned indirectly to scribe lines 14-1 using alignment marks of tape 32, a large tolerance was associated with the alignment of saw blade 22 to scribe lines 14-1.

To accommodate this large tolerance, each of scribe lines 14-1 had a relatively large width WB. More particularly, referring now to FIGS. 1 and 2 together, width WB of scribe lines 14-1 of wafer 30, which was designed to be cut from back-side surface 30B, was significantly larger than width WF of scribe lines 14 of wafer 10, which was designed to be cut from front-side surface 10F. To illustrate, width WB was approximately 0.012 inches (0.305 mm) or more.

Disadvantageously, forming scribe lines 14-1 with a relatively large width WB resulted in less integrated circuits 12 for any given size wafer 30 than the corresponding number of integrated circuits 12 formed in the same size wafer 10, i.e., there was a loss of yield of integrated circuits 12 from wafer 30. As a result, the cost of each integrated circuit 12 from wafer 30 was greater than the cost of each integrated circuit 12 from wafer 10. However, it is desirable to minimize the cost of each integrated circuit 12.

SUMMARY OF THE INVENTION

In accordance with the present invention, a method includes identifying and determining a position of a scribe grid on a front-side surface of a wafer with a camera. Based on this information, a computer aims a laser at a first location on a back-side surface of the wafer. The laser is fired to form a first alignment mark on the back-side surface of the wafer. Advantageously, the alignment mark is positioned with respect to the scribe grid to within tight tolerance, e.g., to within 0.001 inches (0.025 millimeters) or less.

The front-side surface of the wafer is attached to a tape to protect the front-side surface of the wafer during sawing. A saw blade is aligned with a scribe line of the scribe grid using the alignment mark on the backside surface of the wafer. The wafer is cut from the back-side surface along the scribe line with the saw blade.

Advantageously, the wafer is cut from the back-side surface thus protecting the front-side surface of the wafer and, more particularly, the integrated circuits. Of further importance, the saw blade is precisely aligned to the scribe line using the alignment mark such that the scribe line is not fabricated with the extra large width of scribe lines of conventional wafers designed to be cut from the back-side surface.

Recall that in the prior art, in certain instances, it was important to cut the wafer from the back-side surface. However, to accommodate the large tolerance associated with back-side wafer cutting, the wafer designed to be cut from the back-side surface was formed with relatively wide scribe lines. Disadvantageously, forming the scribe lines with a relatively large width resulted in less integrated circuits for any given size wafer, i.e., a loss of yield. This resulted in a substantial increase in the cost of the integrated circuits.

In stark contrast, the wafer is cut from the back-side surface in accordance with the present invention without the associated loss of yield of the prior art. As a result, the integrated circuits of the wafer are protected during singulation yet are fabricated without the associated substantial increase in cost of the prior art.

In accordance with another embodiment of the present invention, an array of packages is marked. In accordance with this embodiment, a back-side surface of the array is scanned by a camera to identify and determine the position of fiducials on the back-side surface. Based on this information, a computer aims a laser at a first location on a front-side surface of the array. The laser is fired to form an alignment mark on the front-side surface of the array. Advantageously, the alignment mark is positioned with respect to the fiducials to within tight tolerance, e.g., to within 0.001 inches (0.025 millimeters) or less.

The back-side surface of the array is attached to a tape. A saw blade is aligned with the array using the alignment mark as a reference. The array is cut with the saw blade thus singulating the packages.

A pick and place machine removes the packages from the tape. Advantageously, the packages are directly removed from the tape by a standard and relatively simple pick and place machine. Accordingly, removal of the packages from the tape is relatively simple and thus low cost. As a result, the packages are fabricated at a low cost.

In the prior art, an array of packages was singulated from the back-side surface. More particularly, the array was placed upside down on the tape such that a layer of encapsulant of the array was adhered to the tape and the fiducials extended upwards and were exposed. The array was singulated by cutting from the back-side surface using the fiducials as a reference.

However, after singulation, the singulated packages had to be removed from the tape and inverted, e.g., using a pick and place machine with flip capability. The singulated packages had to be removed from the tape and inverted so that the singulated packages could be loaded into the grid carrier with the contacts (or other interconnection structure) facing downwards into the grid carrier. Back-end processing, e.g., automated attachment to the printed circuit mother board or automated testing, required that the singulated packages be loaded into the grid carrier in this manner. Disadvantageously, removing the singulated packages from the tape and inverting the packages required complex machinery, was labor intensive and, accordingly, increased the cost of the packages. In contrast, removal of the packages from the tape in accordance with the present invention is relatively simple and thus low cost.

In accordance with one particular embodiment, a structure includes a substrate, e.g., a wafer, having a first surface and a second surface. The structure further includes a reference feature, e.g., a scribe grid, on the first surface and at least one alignment mark on the second surface. The alignment mark has a positional relationship to the reference feature.

In accordance with another embodiment of the present invention, an array of packages includes a substrate having a first section, an electronic component such as an integrated circuit attached to the first section, metallizations on a first surface of the first section, and contacts on the metallizations. Bond pads of the integrated circuit are electrically connected to the contacts by bond wires. A layer of encapsulant covers the integrated circuit, the bond pads, the bond wires, the contacts, and the metallizations. A fiducial is on a first surface of the array and an alignment mark is on a second surface of the array. More particularly, the alignment mark is in the layer of encapsulant.

In one embodiment, a method includes identifying a reference feature on a first surface of a substrate such as a wafer or an array of packages. The method further includes marking a first location on a second surface of the substrate with a first alignment mark. The first alignment mark is used to determine a position of the reference feature.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 3:
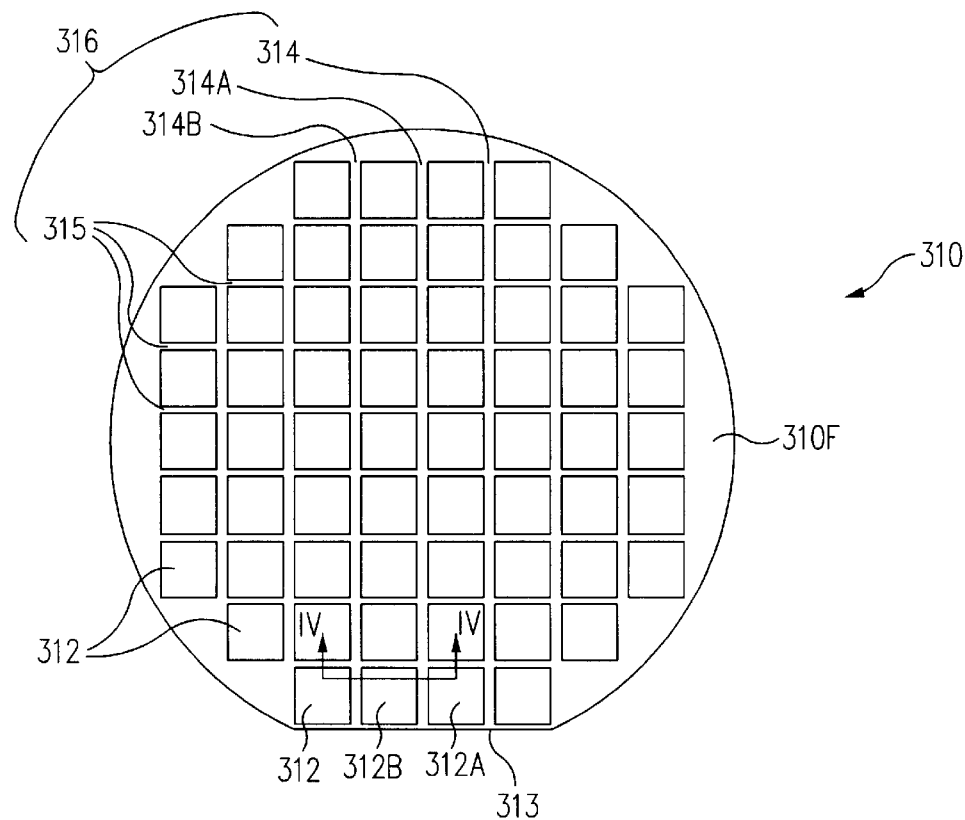
FIG. 3 is a top plan view of a wafer in accordance with the present invention.
Figure 4:
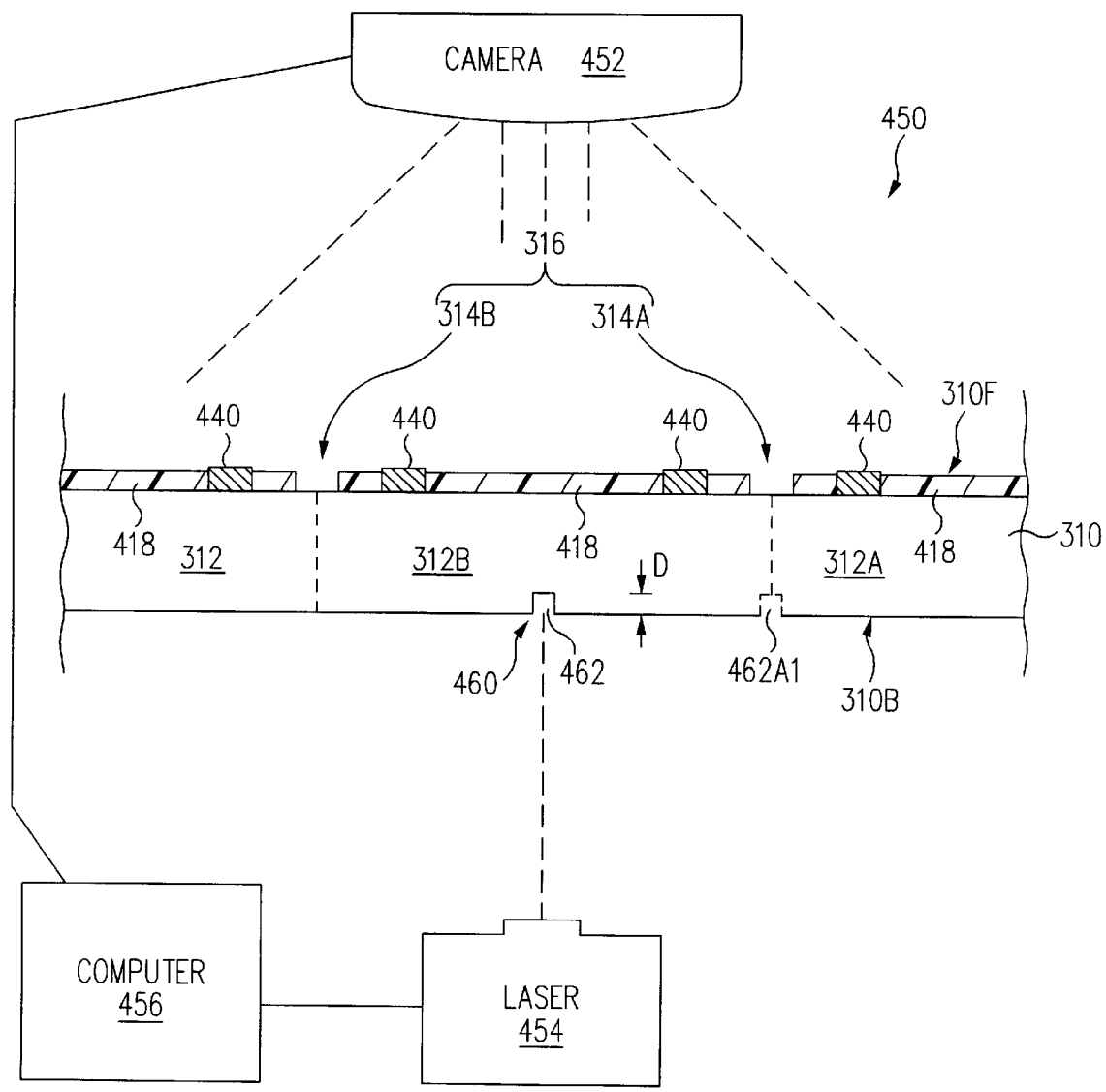
FIG. 4 is an enlarged cross-sectional view of the wafer along the line IV—IV of FIG. 3 being marked on a back-side surface of the wafer in accordance with one embodiment of the present invention.

In accordance with the present invention, referring to FIGS. 3 and 4 together, a method includes identifying and determining a position of a scribe grid 316 on a front-side surface 310F of a wafer 310 with a camera 452. Based on this information, a computer 456 aims a laser 454 at a first location 460 on a back-side surface 310B of wafer 310. Laser 454 is fired to form a first alignment mark 462 on back-side surface 310B of wafer 310. Advantageously, alignment mark 462 is positioned with respect to scribe grid 316 to within tight tolerance, e.g., to within 0.001 inches (0.025 millimeters) or less.

Figure 6:
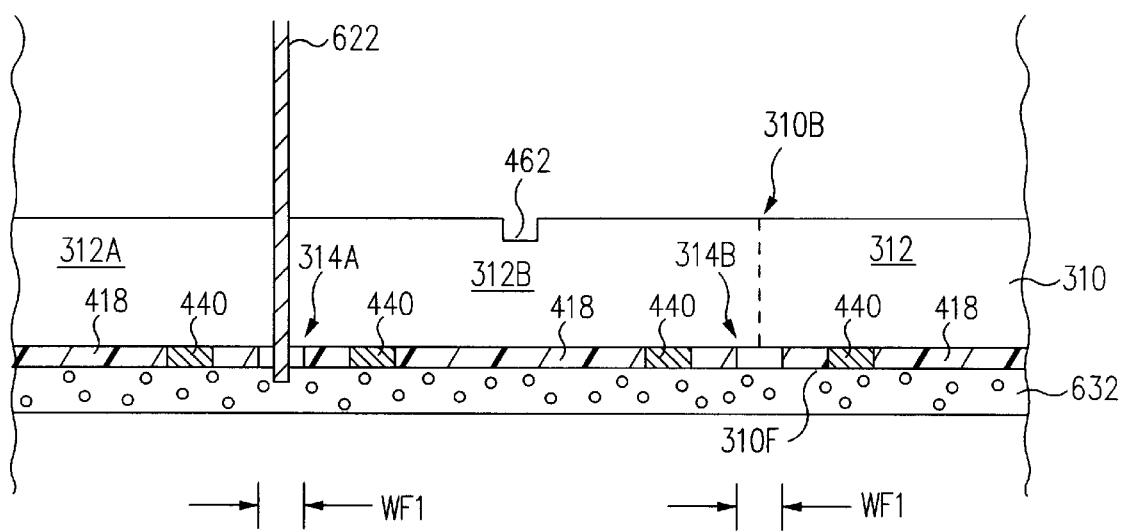
FIG. 6 is a cross-sectional view of the wafer along the line IV—IV of FIG. 3 being cut from the back-side surface of the wafer in accordance with the present invention.

Referring now to FIG. 6, front-side surface 310F of wafer 310 is attached to a tape 632 to protect front-side surface 310F of wafer 310 during sawing. A saw blade 622 is aligned with a scribe line 314A of scribe grid 316 (see FIG. 3) using alignment mark 462. Wafer 310 is cut from back-side surface 310B along scribe line 314A with saw blade 622.

Figure 2:
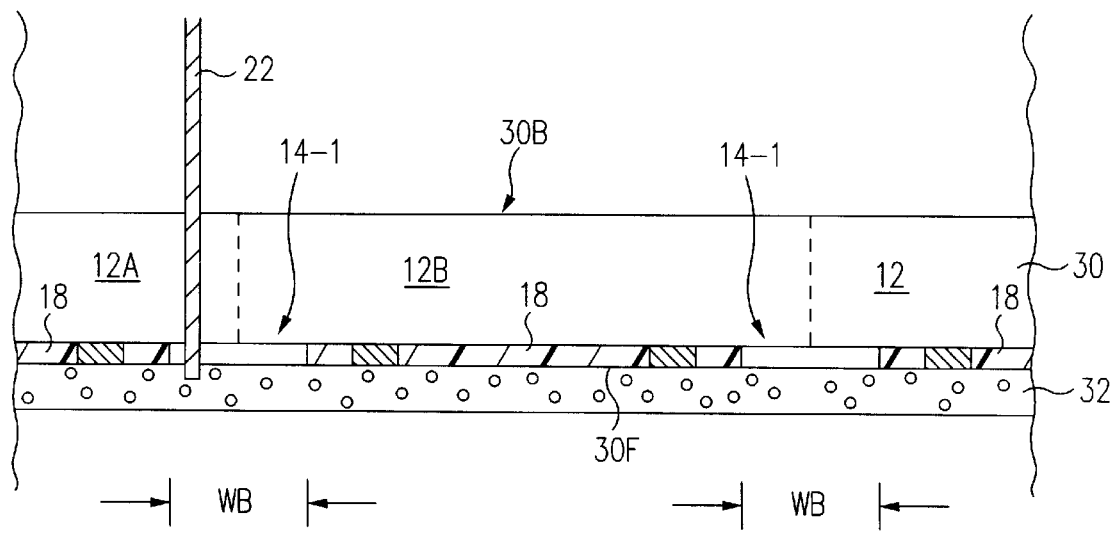
FIG. 2 is a cross-sectional view of a section of a wafer being cut from a back-side surface of the wafer in accordance with the prior art.

Advantageously, wafer 310 is cut from back-side surface 310B thus protecting front-side surface 310F of wafer 310 and, more particularly, integrated circuits 312. Of further importance, saw blade 622 is precisely aligned to scribe line 314A using alignment mark 462 such that scribe line 314A is not fabricated with the extra large width of scribe lines of conventional wafers (e.g., see wafer 30 of FIG. 2) designed to be cut from the backside surface.

Recall that in the prior art, in certain instances, it was important to cut the wafer from the back-side surface. However, to accommodate the large tolerance associated with back-side wafer cutting, the wafer designed to be cut from the back-side surface was formed with relatively wide scribe lines. Disadvantageously, forming the scribe lines with a relatively large width resulted in less integrated circuits for any given size wafer, i.e., a loss of yield. This resulted in a substantial increase in the cost of the integrated circuits.

In stark contrast, wafer 310 is cut from back-side surface 310B without the associated loss of yield of the prior art. As a result, integrated circuits 312 of wafer 310 are protected during singulation yet are fabricated without the associated substantial increase in cost of the prior art.

Figure 7:
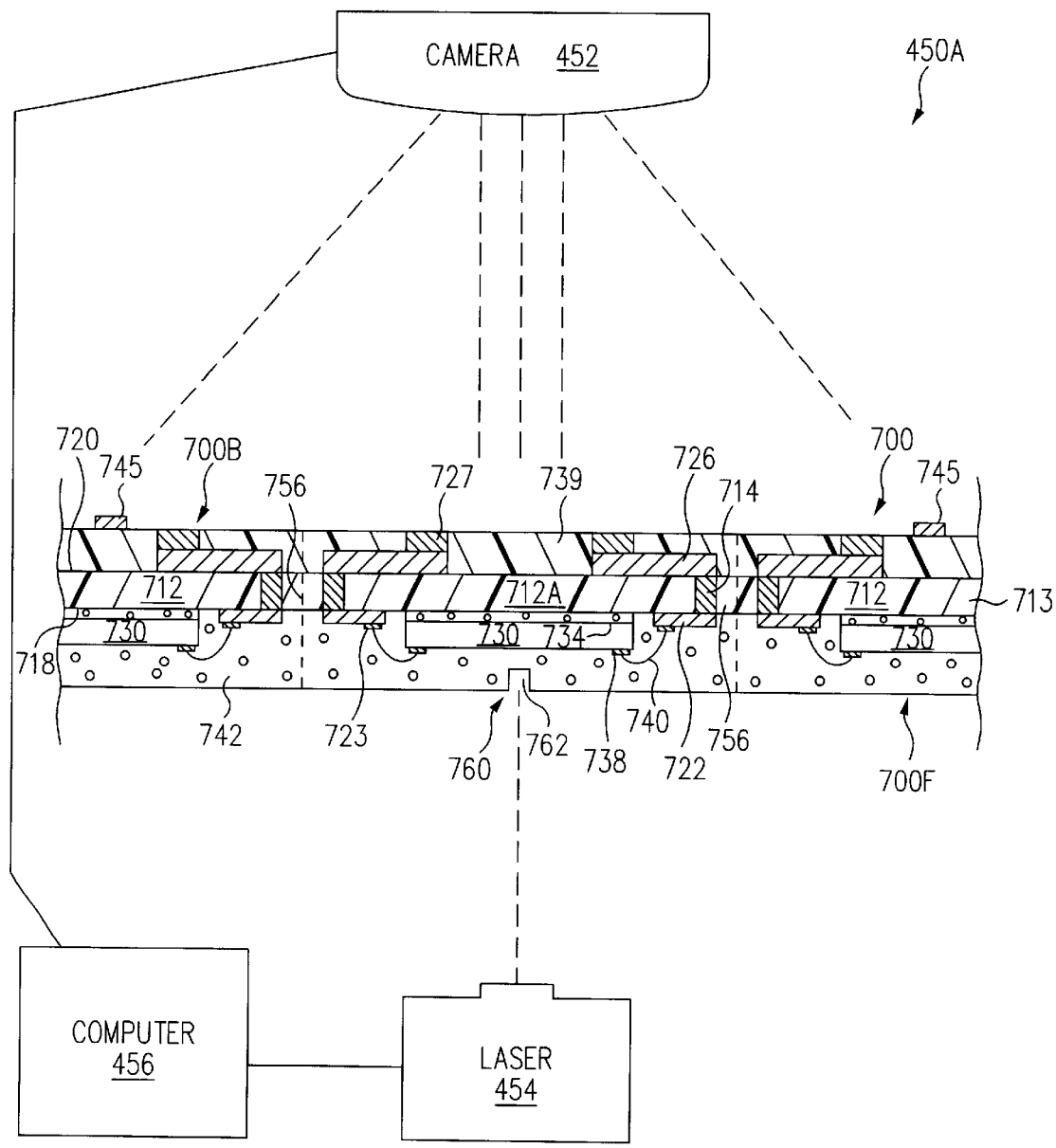
FIG. 7 is an enlarged cross-sectional view of an array of packages being marked in accordance with another embodiment of the present invention.

In accordance with another embodiment of the present invention, referring now to FIG. 7, an array 700 of package is marked. In accordance with this embodiment, a back-side surface 700B of array 700 is scanned by camera 452 to identify and determine the position of fiducials 745 on back-side surface 700B. Based on this information, computer 456 aims laser 454 at a first location 760 on a front-side surface 700F of array 700. Laser 454 is fired to form a first alignment mark 762 on front-side surface 700F of array 700. Advantageously, alignment mark 762 is positioned with respect to fiducials 745 to within tight tolerance, e.g., to within 0.001 inches (0.025 millimeters) or less.

Figure 8:
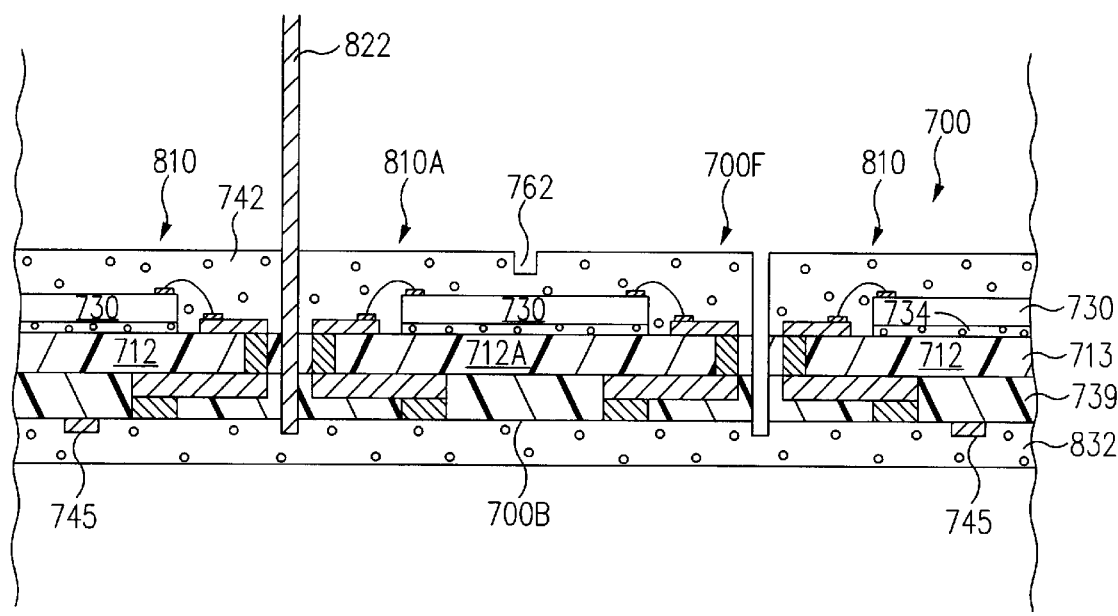
FIG. 8 is a cross-sectional view of the array of FIG. 7 being cut from a front-side surface in accordance with this alternative embodiment of the present invention.

Referring now to FIG. 8, back-side surface 700B of array 700 is attached to a tape 832. A saw blade 822 is aligned with array 700 using alignment mark 762 as a reference. Array 700 is cut with saw blade 822 thus singulating packages 810.

Figure 9:
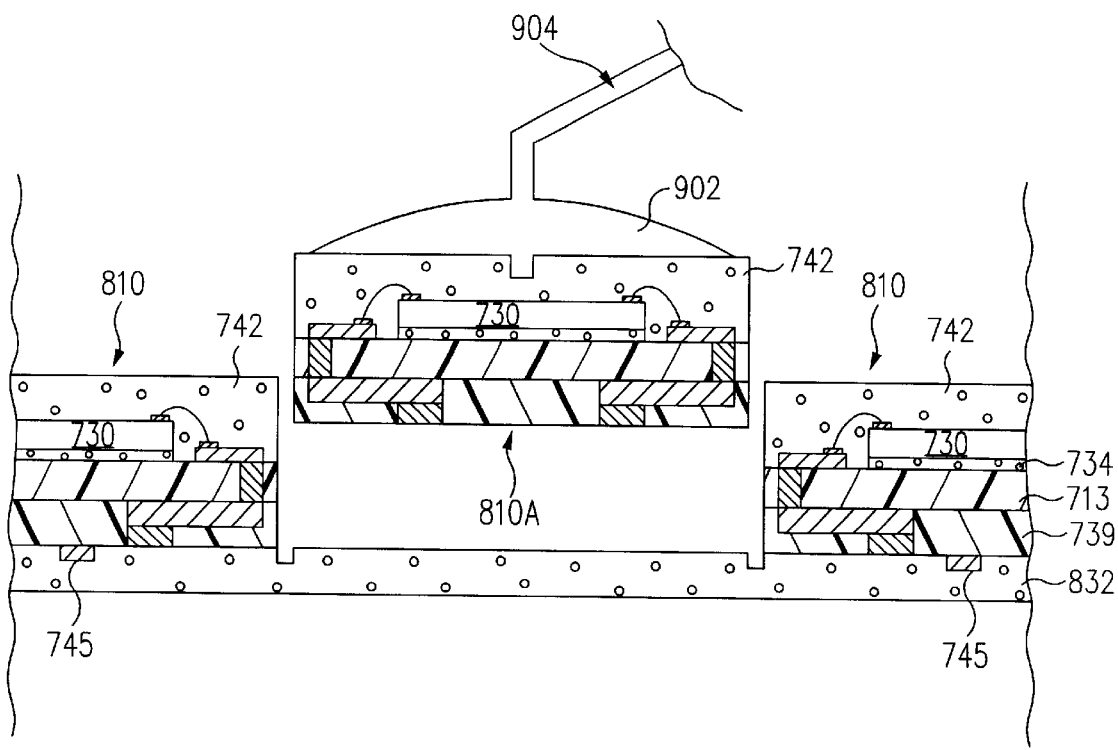
FIG. 9 is a cross-sectional view of a package of the array of FIG. 8 being removed from a tape in accordance with this alternative embodiment of the present invention.

Referring now to FIG. 9, a pick in place machine 904 removes packages 810 from tape 832. Advantageously, packages 810 are directly removed from tape 832 by pick and place machine 904 and placed into the grid carrier (not shown) without having to invert packages 810. Accordingly, removal of packages 810 from tape 832 is relatively simple and thus low cost. As a result, packages 810 are fabricated at a low cost.

In the prior art, referring again to FIG. 8, an array similar to array 700, i.e. an array without alignment marks 762, was singulated from back-side surface 700B. More particularly, the array was placed upside down on tape 832 such that layer of encapsulant 742 was adhered to tape 832 and fiducials 745 extended upwards and were exposed. The array was singulated by cutting from back-side surface 700B using fiducials 745 as a reference.

However, after singulation, the singulated packages had to be removed from tape 832 and inverted, e.g., using a pick and place machine with flip capability. The singulated packages had to be removed from tape 832 and inverted so that the singulated packages could be loaded into the grid carrier with the contacts (or other interconnection structure) facing downwards into the grid carrier. Back-end processing, e.g., automated attachment to the printed circuit mother board or automated testing, required that the singulated packages be loaded into the grid carrier in this manner. Disadvantageously, removing the singulated packages from tape 832 and inverting the packages required complex machinery, was labor intensive and, accordingly, increased the cost of the packages. In contrast, removal of packages 810 from tape 832 in accordance with the present invention is relatively simple and thus low cost.

More particularly, FIG. 3 is a top plan view of a wafer 310, e.g., a substrate, in accordance with the present invention. Formed in wafer 310 are integrated circuits 312, generally referred to as electronic components. Although integrated circuits 312 are set forth as the electronic components formed in wafer 310, electronic components such as micromachine chips or image sensor chips are formed in wafer 310 instead of integrated circuits 312 in other embodiments. For simplicity, integrated circuits 312 are discussed below and illustrated in the figures.

Integrated circuits 312 are delineated by a scribe grid 316, e.g., a reference feature, on a front-side, e.g., first, surface 310F of wafer 310. For example, scribe grid 316 is a silicon oxide layer 418 (illustrated in FIG. 4), which has been selectively etched, on frontside surface 310F.

Scribe grid 316 includes a plurality of vertical scribe lines 314 and a plurality of horizontal scribe lines 315, which delineate adjacent integrated circuits 312. Generally, vertical scribe lines 314 extend in a first direction, e.g., vertical in the view of FIG. 3. Further, horizontal scribe lines 315 extend in a second direction perpendicular to the first direction, e.g., horizontal in the view of FIG. 3. In this embodiment, wafer 310 includes a flat 313, which is a cut straight edge of wafer 310. Flat 313 extends in the second direction, e.g., horizontal in the view of FIG. 3.

FIG. 4 is an enlarged cross-sectional view of wafer 310 along the line IV—IV of FIG. 3 being marked on a back-side, e.g., second, surface 310B of wafer 310 in accordance with one embodiment of the present invention.

As shown in FIG. 4, a first scribe line 314A of the plurality of scribe lines 314 delineates a first integrated circuit 312A of the plurality of integrated circuits 312 from a second integrated circuit 312B of the plurality of integrated circuits 312.

Each integrated circuit 312 includes one or more bond pads 440 on front-side surface 310F. Bond pads 440 are used to form the electrical interconnections with the internal circuitry (not shown) of integrated circuits 312 as is well known to those of skill in the art.

Wafer 310 is placed in an optical alignment and marking system 450, which includes a pattern recognition camera 452 and a laser 454. In this embodiment, camera 452 and laser 454 are coupled to one another, and controlled by, a computer 456.

For example, a model number EV620 precision alignment system manufactured by EV Group Inc., 3701 E. University, Suite 300, Phoenix, Ariz., USA, 1-602-437-9492 is coupled to a laser to form optical alignment and marking system 450. Modifications, e.g., software modifications, to the EV620 precision alignment system are needed for operation with a laser, however, such modifications are minor and not essential to the invention and it is well with in the skill of one skilled in the art of alignment systems to make such modifications. The particular alignment and marking system used is not essential to the invention and other alignment system besides the model number EV620 precision alignment system can be used.

Front-side surface 310F of wafer 310 is optically scanned by camera 452. More particularly, camera 452 identifies one or more features such as scribe grid 316 on front-side surface 310F of wafer 310. Of importance, camera 452 determines the position of the one or more features on front-side surface 310F of wafer 310 to within tight tolerance, e.g., to within one micrometer (1 $\mu$m). This information is supplied from camera 452 to computer 456. Although optical scanning of front-side surface 310F of wafer 310 by camera 452 is described above, in light of this disclosure, it is understood that front-side surface 310F of wafer 310 can be scanned using other techniques, e.g., can be mechanically scanned.

Based on the information from camera 452, computer 456 aims laser 454 at a first location 460 on back-side surface 310B of wafer 310. Laser 454 is fired one or more times to mark location 460 on back-side surface 310B of wafer 310 with a first alignment mark 462. In one embodiment, alignment mark 462 has a depth D in the range of approximately 3 to 5 micrometers ($\mu$m). Laser 454 is re-aimed and re-fired until all alignment marks on back side surface 310B of wafer 310 are formed. Although etching of back-side surface 310B by laser 454 to form at least one alignment mark 462 is described above, in light of this disclosure, it is understood that other techniques such as ink marking can be used to form the alignment marks.

Generally, it is desirable to have contrast between alignment mark 462 and the remainder, i.e., the bulk, of back-side surface 310B so that alignment mark 462 is easily recognized. In one embodiment, where alignment mark 462 is ink, back-side surface 310B is entirely marked, i.e., painted, with a first colored ink, e.g., white or black ink. Alignment mark 462 is formed on the first colored ink with a contrasting second colored ink. For example, back-side surface 310B is painted with white, or black, ink and alignment mark 462 is formed with black, or white, ink, respectively.

Generally, at least one alignment mark 462 is formed. As discussed further below, alignment mark 462 has a positional relationship to scribe grid 316. Stated another way, the position of alignment mark 462 is related to the position of scribe grid 316 such that by knowing the position of alignment mark 462 the position of scribe grid 316 is readily determine. For example, alignment mark 462 is directly aligned with scribe grid 316 or, alternatively, is offset from scribe grid 316 by a certain specified distance.

Figure 5A:
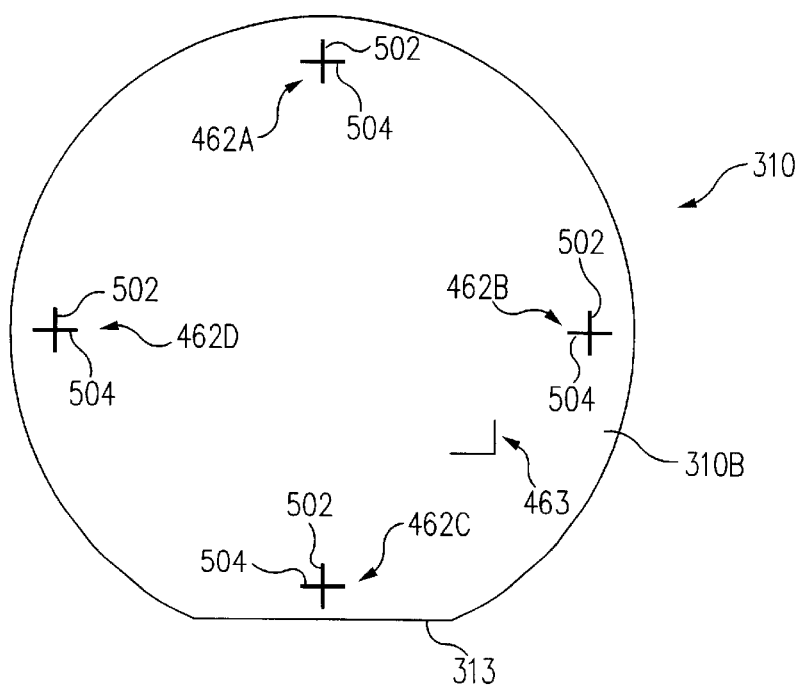
FIGS. 5A, 5B and 5C are bottom plan views of the wafer of FIG. 4 after formation of alignment marks on the back-side surface of the wafer in accordance with various embodiments of the present invention.

FIG. 5A is a bottom plan view of wafer 310 after formation of alignment marks 462A, 462B, 462C, 462D on back-side surface 310B of wafer 310 of FIG. 4 in accordance with one embodiment of the present invention. Referring to FIGS. 4 and 5A together, in accordance with this embodiment, four alignment marks 462A, 462B, 462C, 462D are etched into back-side surface 310B of wafer 310 by laser 454. Further, a 0,0 alignment mark 463 is etched into back-side surface 310B of wafer 310.

0,0 alignment mark 463 identifies a particular singulation street 314 of the plurality of singulation streets 314 and a particular singulation street 315 of the plurality of singulation streets 315. As discussed further below, 0,0 alignment mark 463 is used to control stepping of the saw blade during singulation, e.g., to prevent the saw blade from stepping off of wafer 310 during singulation.

Referring now to alignment mark 462A, alignment mark 462A is a cross etched into back-side surface 310B of wafer 310. More particularly, alignment mark 462A has a vertical, e.g., first, segment 502 and a horizontal, e.g., second, segment 504 perpendicular to vertical segment 502. Segments 502 and 504 intersect one another at the approximate centers of segments 502 and 504. Illustratively, segments 502 and 504 each have a width of 0.0005 inches (0.013 mm) and a length of 0.020 inches (0.508 mm).

In accordance with this embodiment, referring now to FIGS. 3 and 5A together, vertical segment 502 of alignment mark 462A is parallel to vertical scribe lines 314 of scribe grid 316. Similarly, horizontal segment 504 of alignment mark 462A is parallel to horizontal scribe lines 315 of scribe grid 316.

Advantageously, vertical segment 502 of alignment mark 462A is positioned with respect to vertical scribe lines 314 to within tight tolerance, e.g., to within 0.001 in. (0.025 mm) or less. In one embodiment, vertical segment 502 is located equidistant from directly adjacent vertical scribe lines 314. To illustrate, alignment mark 462 of FIG. 4 is locate equidistant from directly adjacent and parallel vertical scribe lines 314A and 314B. In another embodiment, vertical segment 502 is directly coincident with a vertical scribe line 314. To illustrate, an alignment mark 462A1 (indicated in dashed lines) of FIG. 4 is directly coincident with vertical scribe line 314A.

Similarly, referring again to FIGS. 3 and 5A, horizontal segment 504 of alignment mark 462A is positioned with respect to horizontal scribe lines 315 to within tight tolerance, e.g., to within 0.001 in. (0.025 mm) or less. In one embodiment, horizontal segment 504 is directly coincident with a horizontal scribe line 315. In another embodiment, horizontal segment 504 is located equidistant from directly adjacent and parallel horizontal scribe lines 315.

Alignment marks 462B, 462C, 462D have vertical segments 502 and horizontal segments 504 and are substantially similar to alignment mark 462A and so are not discussed further to avoid detracting from the principals of the invention.

FIG. 6 is a cross-sectional view of wafer 310 along the line IV—IV of FIG. 3 being cut from back-side surface 310B in accordance with this embodiment of the present invention. After wafer 310 is marked by optical alignment and marking system 450 (FIG. 4), front-side surface 310F of wafer 310 is attached to a tape 632. For example, front-side surface 310F of wafer 310 is attached to tape 632 to protect front-side surface 310F of wafer 310 during sawing. Tape 632 supports wafer 310 during sawing.

A saw blade 622 is aligned with scribe line 314A using one or more alignment marks 462 (hereinafter referred to as alignment mark 462 for simplicity) as a reference, e.g., see alignment marks 462A, 462B, 462C, 462D of FIG. 5A. More particularly, the position of scribe line 314A is determined from alignment mark 462 and this information is used to align saw blade 622 with scribe line 314A. For example, an optical or mechanical alignment system, which are well known to those of skill in the art, aligns saw blade 622 with scribe line 314A using alignment mark 462 as a reference. In one embodiment, light is shined at an angle to back-side surface 310B to enhance the contrast between alignment mark 462 and the bulk of back-side surface 310B to enhance recognition of alignment mark 462.

Since alignment mark 462 is positioned with respect to scribe line 314A to within tight tolerance, e.g., to within 0.001 in. (0.025 mm) or less, saw blade 622 is precisely aligned to scribe line 314A. Wafer 310 is cut from back-side surface 310B along scribe line 314A with saw blade 622. Although cutting of wafer 310 with saw blade 622 is described, in light of this disclosure, it is understood that other techniques for cutting wafer 310 can be used, e.g., laser cutting.

Advantageously, saw blade 622 is precisely aligned to scribe line 314A such that wafer 310 is precisely cut along scribe line 314A. Since wafer 310 is precisely cut along scribe line 314A, scribe line 314A is not fabricated with the extra large width of scribe lines of conventional wafers (e.g., see wafer 30 of FIG. 2) designed to be cut from the back-side surface. Accordingly, scribe line 314A is relatively narrow and has a narrow width WF1.

Figure 1:
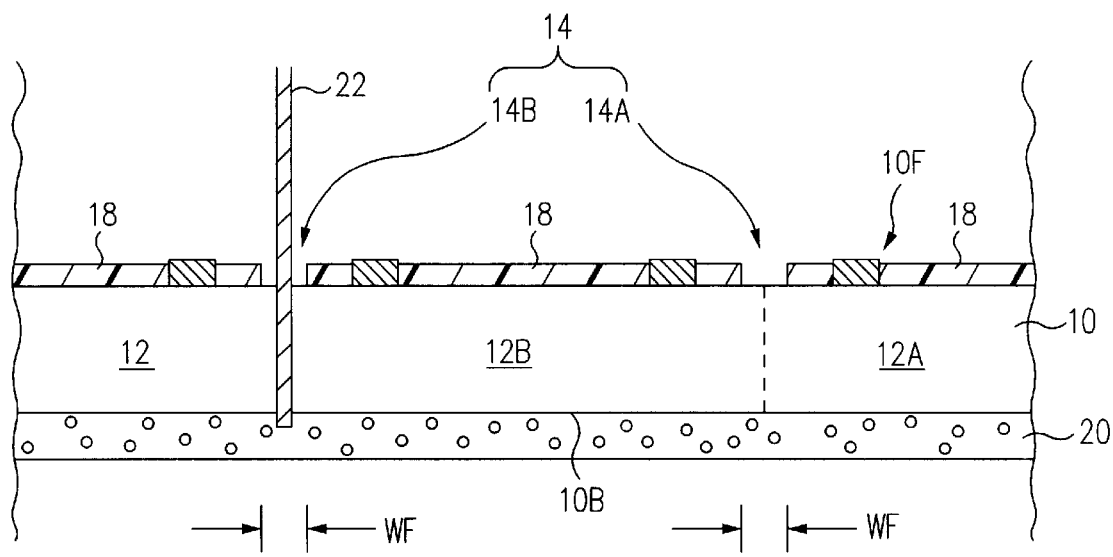
FIG. 1 is a cross-sectional view of a section of a wafer being cut from a front-side surface of the wafer in accordance with the prior art.

In one embodiment, width WF1 of scribe line 314A is the same as width WF (FIG. 1) of a scribe line 14 of wafer 10, which was designed to be cut from front-side surface 10F. For example, width WF1 is in the range of approximately 0.002 inches (0.051 mm) to 0.008 inches (0.203 mm) and in one particular embodiment is within the range of 0.002 inches (0.051 mm) to 0.003 inches (0.076 mm) or less.

Although cutting of wafer 310 from back-side surface 310B along scribe line 314A is described above, in light of this disclosure, those of skill in the art will understand that wafer 310 is cut along scribe lines 314 and 315 (FIG. 3), i.e., along scribe grid 316, using alignment mark 462 as a reference in a similar manner to that described above with regard to scribe line 314A. Saw blade 622 cuts wafer 310 from back-side surface 310B along scribe grid 316 thus singulating integrated circuits 312.

More particularly, 0,0 alignment mark 463 (FIG. 5A) is used to identify which particular singulation street 314 (or 315) of the plurality of singulation street 314 (or 315) is being sawed. After sawing of the particular singulation street 314 (or 315), wafer 310 is stepped, i.e., moved a fixed distance, such that saw blade 622 is precisely aligned with the adjacent singulation street 314 (or 315). The adjacent singulation street 314 (or 315) is then sawed. This iterative process is repeated until all of singulation streets 314 (or 315) are sawed. Wafer 310 is then rotated 90°.

After rotation of wafer 310, 0,0 alignment mark 463 (FIG. 5A) is used to identify which particular singulation street 315 (or 314) of the plurality of singulation streets 315 (or 314) is being sawed. After sawing of the particular singulation street 315 (or 314), wafer 310 is stepped, i.e., moved a fixed distance, such that saw blade 622 is precisely aligned with the adjacent singulation street 315 (or 314). The adjacent singulation street 315 (or 314) is then sawed. This iterative process is repeated until all of singulation street 315 (or 314) are sawed and wafer 310 is singulated.

Advantageously, wafer 310 is cut from back-side surface 310B thus protecting front-side surface 310F of wafer 310 and, more particularly, integrated circuits 312. Of further importance, the width of scribe lines 314, 315 is significantly less than that of conventional wafers designed to be cut from the back-side surface.

Recall that in the prior art, in certain instances, it was important to cut the wafer from the back-side surface. However, to accommodate the large tolerance associated with back-side wafer cutting, the wafer designed to be cut from the back-side surface was formed with relatively wide scribe lines. Disadvantageously, forming the scribe lines with a relatively large width resulted in less integrated circuits for any given size wafer, i.e., a loss of yield. This resulted in a substantial increase in the cost of the integrated circuits.

In stark contrast, wafer 310 is cut from back-side surface 310B without the associated loss of yield of the prior art. As a result, integrated circuits 312 of wafer 310 are protected during singulation yet are fabricated without the associated substantial increase in cost of the prior art.

Figure 5B:
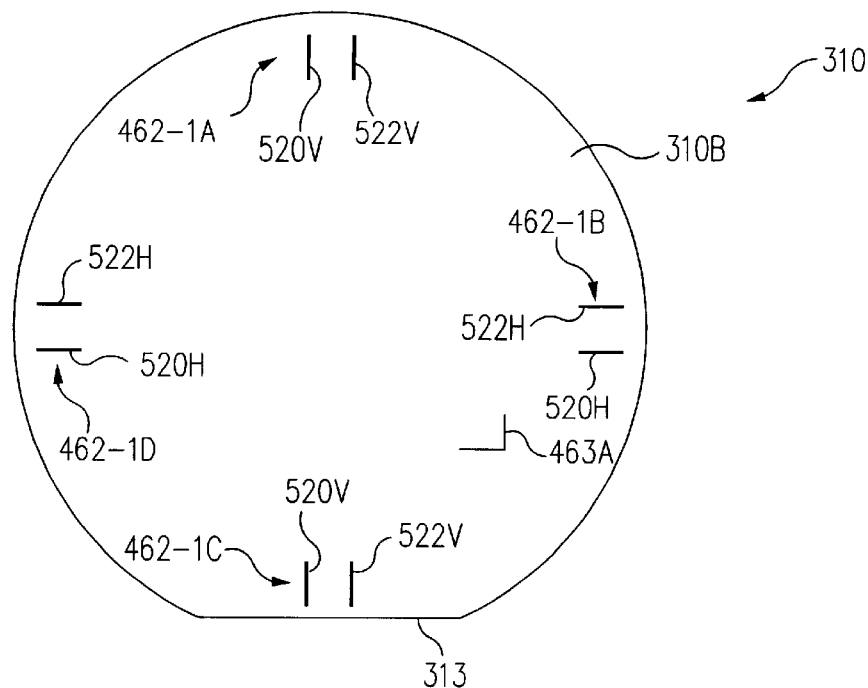

FIG. 5B is a bottom plan view of wafer 310 after formation of alignment marks 462-1A, 462-1B, 462-1C, 462-1D and 0,0 alignment mark 463A on back-side surface 310B of wafer 310 of FIG. 3 in accordance with another embodiment of the present invention. Alignment marks 462-1A, 462-1B, 462-1C, 462-1D and 0,0 alignment mark 463A of FIG. 5B are substantially similar to alignment marks 462A, 462B, 462C, 462D and 0,0 alignment mark 463 of FIG. 5A and are used in the same manner except as discussed below.

Referring now to alignment mark 462-1A of FIG. 5B, alignment mark 462-1A includes a first segment 520V and a second segment 522V etched into back-side surface 310B of wafer 310. In accordance with this embodiment, segment 520V is a first line illustratively having a length of 0.020 inches (0.508 mm) and a width of 0.0005 inches (0.013 mm) and segment 522V is a second line illustratively having a length of 0.020 inches (0.508 mm) and a width of 0.0005 inches (0.013 mm). Segment 520V is aligned with and parallel to segment 522V and is spaced apart from segment 522V by a fixed distance, illustratively, 0.002 inches (0.051 mm).

Referring now to FIGS. 3 and 5B together, segments 520V, 522V are parallel to vertical scribe lines 314 of scribe grid 316. Advantageously, segments 520V, 522V are positioned with respect to vertical scribe lines 314 to within tight tolerance, e.g., to within 0.001 in. (0.025 mm) or less. In one embodiment, segments 520V, 522V are formed on either side of a particular scribe line 314, e.g., scribe line 314A. Thus, by cutting wafer 310 from back-side surface 310B in the vertical direction in between segments 520V, 522V, wafer 310 is cut along the particular scribe line 314, e.g., is cut along scribe line 314A. Alignment mark 462-1C is substantially similar to alignment mark 462-1A and so is not discussed further to avoid detracting from the principals of the invention.

Referring now to alignment mark 462-1B of FIG. 5B, alignment mark 462-1B includes a first segment 520H and a second segment 522H etched into back-side surface 310B of wafer 310. In accordance with this embodiment, segment 520H is a first line illustratively having a length of 0.020 inches (0.508 mm) and a width of 0.0005 inches (0.013 mm) and segment 522H is a second line illustratively having a length of 0.020 inches (0.508 mm) and a width of 0.0005 inches (0.013 mm). Segment 520H is aligned with and parallel to segment 522H and is spaced apart from segment 522H by a fixed distance, illustratively, 0.002 inches (0.051 mm).

Referring now to FIGS. 3 and 5B together, segments 520H, 522H are parallel to horizontal scribe lines 315 of scribe grid 316. Advantageously, segments 520H, 522H are positioned with respect to horizontal scribe lines 315 to within tight tolerance, e.g., to within 0.001 in. (0.025 mm) or less. In one embodiment, segments 520H, 522H are formed on either side of a particular scribe line 315. Thus, by cutting wafer 310 from back-side surface 310B in the horizontal direction in between segments 520H, 522H, wafer 310 is cut along the particular scribe line 315. Alignment mark 462-1D is substantially similar to alignment mark 462-1B and so is not discussed further to avoid detracting from the principals of the invention.

Figure 5C:
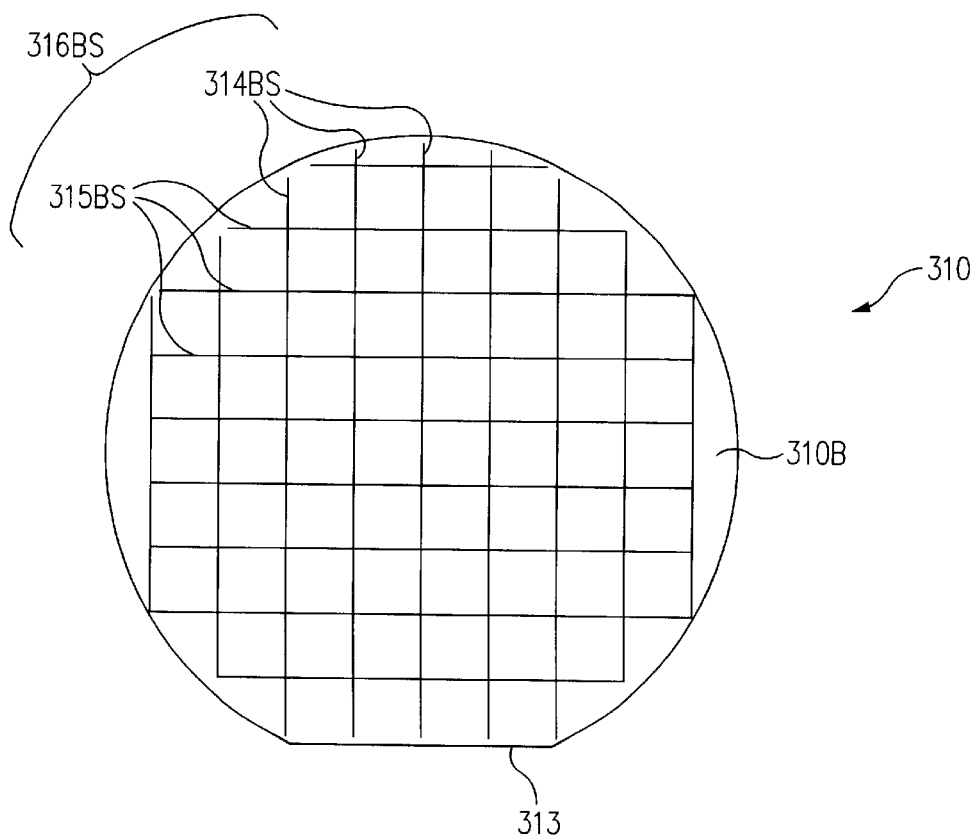

FIG. 5C is a bottom plan view of wafer 310 after formation of an alignment mark 316BS on back-side surface 310B of wafer 310 of FIG. 3 in accordance with another embodiment of the present invention. In accordance with this embodiment, alignment mark 316BS is shaped as a scribe grid and includes a plurality of vertical scribe lines 314BS and a plurality of horizontal scribe lines 315BS.

Referring now to FIGS. 3 and 5C, each vertical scribe line 314BS and each horizontal scribe line 315BS on back-side surface 310B of wafer 310 is directly coincident with a corresponding vertical scribe line 314 and a corresponding horizontal scribe line 315, respectively, on front-side surface 310F of wafer 310. Stated another way, alignment mark 316BS on back-side surface 310B precisely corresponds with scribe grid 316 on front-side surface 310F. Accordingly, by cutting. wafer 310 from back-side surface 310B along vertical scribe lines 314BS and horizontal scribe lines 315BS, wafer 310 is precisely cut along vertical scribe lines 314 and horizontal scribe lines 315, i.e., along scribe grid 316, on front-side surface 310F.

Advantageously, conventional optical or mechanical alignment systems readily align saw blade 622 (FIG. 6) to alignment mark 316BS without performing any positional calculations. As a result, there is less chance of error in alignment of saw blade 622 and in cutting of wafer 310. Further, the operator of saw blade 622 can visually detect when an error in sawing occurs.

FIG. 7 is an enlarged cross-sectional view of an array 700 of packages being marked in accordance with another embodiment of the present invention. Array 700 can be fabricated using any one of a number of techniques such as that set forth in Glenn et al., U.S. Pat. No. 5,981,314, which is herein incorporated by reference in its entirety.

Referring to FIG. 7, array 700 includes a substrate 713 having a plurality of section 712. After singulation, a package is formed from each section 712. Referring to a first section 712A of the plurality of sections 712, metallizations 722, 726 are formed on first and second surfaces 718, 720, respectively of substrate 713. Corresponding metallizations 722, 726 are electrically connected to one another by corresponding conductive through-holes 714. Contact 723, 727 are formed on corresponding metallizations 722, 726, respectively. A solder mask 739 is over portions of second surface 720 and metallizations 726 but does not cover contacts 727.

An integrated circuit 730, i.e., an electronic component, sometimes called an IC chip, is attached to first surface 718 of section 712 by adhesive 734. Bond pads 738, sometimes called bonding pads, are electrically connected to corresponding contacts 723 by corresponding bond wires 740.

Referring generally to array 700, a layer of encapsulant 742 covers integrated circuits 730 including bond pads 738, bond wires 740, contacts 723, metallizations 722 and the remaining exposed first surface 718 of substrate 713.

Array 700 is placed in optical alignment and marking system 450A, such as that described above that reference to FIG. 4. A back-side, e.g., first, surface 700B of array 700 is optically scanned by camera 452. In one embodiment, back-side surface 700B includes one or more fiducials 745, sometimes called reference marks, which are used for aligning substrate 713 during processing. Camera 452 identifies and determines the position of fiducials 745 on back-side surface 700B of array 700. More generally, camera 452 identifies one or more features on back-side surface 700B of array 700. of importance, camera 452 determines the position of fiducials 745 to within tight tolerance, e.g., to within 1 μm. This information is supplied from camera 452 to computer 456. Although optical scanning of back-side surface 700B of array 700 by camera 452 is described above, in light of this disclosure, it is understood that back-side surface 700B of array 700 can be scanned using other techniques, e.g., can be mechanically scanned.

Based on the information from camera 452, computer 456 aims laser 454 at a first location 760 on a frontside, e.g., second, surface 700F of array 700, and, more particularly, on layer of encapsulant 742. Laser 454 is fired one or more times to mark front-side surface 700F of array 700 with a first alignment mark 762 in layer of encapsulant 742. Laser 454 is re-aimed and re-fired until all alignment marks on front-side surface 700F of array 700 are formed. Generally, at least one alignment mark 762 is formed. Illustratively, five alignment marks 762 similar to alignment marks 462A, 462B, 462C, 462D, 0,0 alignment mark 463 of FIG. 5A or alignment marks 462-1A, 462-1B, 462-1C, 462-1D, 0,0 alignment mark 463A of FIG. 5B are formed. As a further illustration, alignment mark 762 is similar to alignment mark 316BS of FIG. 5C. Advantageously, alignment mark (s) 762 are positioned with respect to fiducials 745 to within tight tolerance, e.g., to within 0.001 in. (0.025 mm) or less.

Although etching of front-side surface 700F and, more particularly, etching of layer of encapsulant 742, by laser 454 to form at least one alignment mark 762 is described above, in light of this disclosure, it is understood that other techniques such as ink marking can be used to form the alignment marks.

FIG. 8 is a cross-sectional view of array 700 of FIG. 7 being cut from front-side surface 700F in accordance with this alternative embodiment of the present invention. After array 700 is marked by optical alignment and marking system 450A (FIG. 6), back-side surface 700B of array 700 is attached to a tape 832. Tape 832 supports array 700 during sawing.

A saw blade 822 is aligned with array 700 using alignment marks 762 as a reference. For example, an optical or mechanical alignment system, which are well known to those of skill in the art, aligns saw blade 822 to array 700 using alignment marks 762 as a reference.

Since alignment marks 762 are positioned with respect to fiducials 745 and, more generally, to substrate 713 to within tight tolerance, saw blade 822 is precisely aligned to cut along peripheries 756 (FIG. 7) of sections 712. Substrate 713 and layer of encapsulant 742 are cut along peripheries 756 of sections 712 (e.g., see lines 56, 58 of FIG. 3A of Glenn et al., U.S. Pat. No. 5,981,314, cited above) thus singulating packages 810. For example, a first package 810A includes section 712A and the attached integrated circuit 730.

FIG. 9 is a cross-sectional view of package 810A being removed from tape 832 in accordance with this alternative embodiment of the present invention. A vacuum pickup head 902 of a pick and place machine 904 attaches to layer of encapsulant 742 of package 810A. Pick and place machine 904 removes package 810A from tape 832. Package 810A is either packaged for shipment or further processed as is well known to those of skill in the art. The other packages 810 are similarly removed from tape 832 by pick and place machine 904.

Advantageously, packages 810 are directly removed from tape 832 by pick and place machine 904 and loaded for shipment or further processing, e.g., in a grid carrier. Accordingly, removal of packages 810 from tape 832 is relatively simple and thus low cost. As a result, packages 810 are fabricated at a low cost.

In the prior art, an array similar to array 700, i.e., an array without alignment marks 762, was singulated from back-side surface 700B. More particularly, referring to FIG. 8, the array was placed upside down on tape 832 such that layer of encapsulant 742 was adhered to tape 832 and fiducials 745 extended upwards and were exposed. The array was singulated by cutting from back-side surface 700B using fiducials 745 as a reference.

However, after singulation, the singulated packages had to be removed from tape 832 and inverted, e.g., using a pick and place machine with flip capability. The singulated packages had to be removed from tape 832 and inverted so that the singulated packages could be loaded into the grid carrier with the contacts (or other interconnection structure) facing downwards into the grid carrier. Back-end processing, e.g., automated attachment to the printed circuit mother board or automated testing, required that the singulated packages be loaded into the grid carrier in this manner. Disadvantageously, removing the singulated packages from tape 832 and inverting the packages required complex machinery, was labor intensive and, accordingly, increased the cost of the packages.

This application is related to Glenn et al., commonly assigned and co-filed U.S. patent application Ser. No. 09/558392, entitled "PRECISION MARKING AND SINGULATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A structure comprising:
   a substrate comprising a first surface and a second surface, wherein said substrate is a wafer comprising electronic components;
   a reference feature on said first surface, wherein said reference feature is a scribe grid; and
   at least one alignment mark on said second surface, said at least one alignment mark having a defined positional relationship to said reference feature.

2. The structure of claim 1 wherein said electronic components are delineated by said scribe grid.

3. The structure of claim 1 wherein said electronic components comprise bond pads on said first surface.

4. A structure comprising:
   a substrate comprising a first surface and a second surface;
   a reference feature on said first surface, wherein said reference feature is a scribe grid, said scribe grid being a silicon oxide layer which has been selectively etched; and
   at least one alignment mark on said second surface, said at least one alignment mark having a defined positional relationship to said reference feature.

5. A structure comprising:
   a substrate comprising a first surface and a second surface;
   a reference feature on said first surface, wherein said reference feature is a scribe grid, said scribe grid comprising a first scribe line extending in a first direction; and
   at least one alignment mark on said second surface, said at least one alignment mark having a defined positional relationship to said reference feature.

6. The structure of claim 5 wherein said at least one alignment mark has a first segment parallel to said first scribe line.

7. The structure of claim 6 wherein said first segment is positioned with respect to said first scribe line to within 0.001 inches (0.025 millimeters) or less.

8. The structure of claim 6 wherein said first segment is directly coincident with said first scribe line.

9. The structure of claim 6 wherein said scribe grid further comprises a second scribe line parallel to said first scribe line, said first segment being located equidistant from said first scribe line and said second scribe line.

10. The structure of claim 6 wherein said scribe grid further comprises a second scribe line extending in a second direction perpendicular to said first direction.

11. The structure of claim 10 wherein said at least one alignment mark has a second segment parallel to said second scribe line.

12. The structure of claim 11 wherein said at least one alignment mark is a cross etched into said second surface.

13. The structure of claim 5 wherein said substrate comprises a flat extending in a second direction perpendicular to said first direction.

14. A structure comprising:
   a substrate comprising a first surface and a second surface;
   a reference feature on said first surface, wherein said reference feature is a fiducial; and
   at least one alignment mark on said second surface, said at least one alignment mark having a defined positional relationship to said reference feature.

15. The structure of claim 14 wherein said at least one alignment mark is in a layer of encapsulant.

16. The structure of claim 15 wherein said substrate is an array of packages.

17. A structure comprising:
   a substrate comprising a first surface and a second surface;
   a reference feature on said first surface;
   at least one alignment mark on said second surface, said at least one alignment mark having a defined positional relationship to said reference feature; and
   a tape, said first surface being attached to said tape.

18. A structure comprising:
   a substrate comprising a first surface and a second surface, wherein said substrate is a wafer comprising electronic components;
   a reference feature on said first surface; and
   at least one alignment mark on said second surface, said at least one alignment mark having a defined positional relationship to said reference feature, wherein said at least one alignment mark comprises a first segment and a second segment, said first segment being parallel to and spaced apart from said second segment.

19. A structure comprising:
   a substrate comprising a first surface and a second surface;
   a reference feature on said first surface; and
   at least one alignment mark shaped as a scribe grid having a plurality of first scribe lines extending in a first direction and a plurality of second scribe lines extending in a second direction perpendicular to said first direction on said second surface, said at least one alignment mark having a defined positional relationship to said reference feature.

20. A structure comprising:
   a substrate comprising a first surface and a second surface;
   a reference feature on said first surface; and
   at least one alignment mark on said second surface, said at least one alignment mark having a defined positional relationship to said reference feature, wherein said at least one alignment mark is ink.

21. An array of packages comprising:
   a substrate having a first section;
   an electronic component attached to said first section;
   metallizations on a first surface of said first section;
   contacts on said metallizations, wherein bond pads of said electronic component are electrically connected to said contacts by bond wires;

a layer of encapsulant covering said electronic component, said bond pads, said bond wires, said contacts, and said metallizations;

a fiducial on a first surface of said array; and an alignment mark on a second surface of said array, said alignment mark being in said layer of encapsulant.

22. A structure comprising:

a substrate comprising a first surface and a second surface, wherein said substrate is a wafer comprising electronic components selected from the group consisting of micromachine chips and image sensor chips;

a reference feature on said first surface; and at least one alignment mark on said second surface, said at least one alignment mark having a defined positional relationship to said reference feature.

23. A structure comprising:

a substrate comprising a first surface and a second surface, wherein said substrate is a wafer comprising electronic components;

a reference feature on said first surface; and at least one alignment mark on said second surface, said at least one alignment mark having a defined positional relationship to said reference feature, wherein said at least one alignment mark comprises a vertical segment and a horizontal segment intersecting said vertical segment, said horizontal segment being perpendicular to said vertical segment.

24. The structure of claim 23 wherein said reference feature comprises a scribe grid comprising:

a vertical scribe line, said vertical segment being parallel to said vertical scribe line; and a horizontal scribe line, said horizontal segment being parallel to said horizontal scribe line.

25. A structure comprising:

a substrate comprising a first surface and a second surface, wherein said substrate is a wafer comprising electronic components;

a reference feature on said first surface; and at least one alignment mark on said second surface, said at least one alignment mark having a defined positional relationship to said reference feature, wherein said reference feature comprises a first scribe grid on said first surface and wherein said at least one alignment mark comprises a second scribe grid on said second surface.

* * * * *